United States Patent [19]

Ihm

[11] Patent Number: 5,418,428
[45] Date of Patent: May 23, 1995

[54] WAVEGUIDE SYSTEM WITH SUPPORT FOR MAGNETRONS

[75] Inventor: Jong H. Ihm, Kyungsangbook-Do, Rep. of Korea

[73] Assignee: Goldstar Co., Ltd., Seoul, Rep. of Korea

[21] Appl. No.: 986,701

[22] Filed: Dec. 8, 1992

[30] Foreign Application Priority Data

Dec. 13, 1991 [KR] Rep. of Korea .............. 22827/1991

[51] Int. Cl.6 .................. H01P 5/103; H01J 23/40
[52] U.S. Cl. .................. 315/39.53; 333/26; 333/33
[58] Field of Search .................. 333/26, 33; 315/39.53

[56] References Cited

U.S. PATENT DOCUMENTS

| | | | |
|---|---|---|---|
| 2,972,084 | 2/1961 | Esterson et al. | 315/39.53 |
| 4,002,943 | 1/1977 | Regan et al. | 333/26 X |
| 4,556,853 | 12/1985 | Clark | 333/26 |
| 5,148,131 | 9/1992 | Amboss et al. | 333/26 |
| 5,212,461 | 5/1993 | Aicardi et al. | 333/26 X |

FOREIGN PATENT DOCUMENTS

| | | | |
|---|---|---|---|
| 211834 | 8/1989 | Japan | 315/39.53 |
| 4044402 | 2/1992 | Japan | 333/26 |

Primary Examiner—Benny T. Lee

[57] ABSTRACT

A support for a waveguide system includes a support body, a receiver formed at one side portion of the support body, a control plates selectively coupled to the receiver and adapted to control the coupling condition between the support body and a magnetron separably coupled to the support body to achieve a matching condition of impedance, thereby capable of a measurement of the characteristic of one of two kinds of magnetrons with different antenna dimensions, and a closing plate coupled to the receiver when the control plate is not coupled to the receiver and the characteristic of the other kind of magnetron is to be measured and adapted to close the receiver. The support enables measurements of the characteristics of a plurality of magnetrons having different dimensions. The support also eliminates the work of replacing the waveguide system every time when different models of magnetrons are measured.

7 Claims, 6 Drawing Sheets

WAVEGUIDE SYSTEM WITH SUPPORT FOR MAGNETRONS

BACKGROUND OF THE INVENTION

1. Field of the Invention

The present invention relates to a waveguide system for measuring the output characteristics of magnetrons which are microwave oscillators, and more particularly to a support for a waveguide system capable of measuring the output characteristics of a plurality of magnetrons having different dimensions.

2. Description of the Prior Art

Referring to FIGS. 1A and 1B, there is illustrated a waveguide system used as a conventional device for measuring output characteristics of magnetrons. As shown in FIGS. 1A and 1B, the waveguide system comprises a support 1, a taper type waveguide 2 hermetically coupled at one end thereof to one end of the support 1, a double slug tuner 3 hermetically coupled at one end thereof to the other end of the waveguide 2, a directional coupler 4 hermetically coupled at one end thereof to the other end of the double slug tuner 3, and a dummy load 5 hermetically coupled to the other end of the directional coupler 4. To the support 1 is coupled a magnetron 6. The waveguide 2 serves to eliminate a reflection coefficient based variations of the microwave. On the other hand, the double slug tuner 3 serves to optionally provide a reflection coefficient of the microwave. The directional coupler 4 senses the output characteristic of the microwave. The dummy load 5 is used as a reflectionless terminator for attenuating the microwave passing the directional coupler 4, to remove it.

When the characteristic of a magnetron is to be measured by using the waveguide system with the above-mentioned construction, an antenna 7 (see FIG. 1A) of the magnetron, which is denoted by the reference numeral 6, is coupled to the launcher 1. As electric power is applied to the waveguide system, an impedance between the support 1 and a load is determined depending on the vertical dimension of a back flange 8 (see FIG. 1A) of the support 1. Microwave energy generated in the interior of magnetron 6 is transferred to the waveguide system. At this time, in order to find the output characteristic of magnetron under the condition that no reflected wave is basically present, the coupling degree between the support 1 and the antenna 7, which is an output unit of the magnetron 6 should be properly determined for maintaining the matching condition of impedance.

FIG. 2A shows a condition where a standard support and a magnetron are coupled. Where the height of the antenna $7a$ of magnetron is about 29 mm to about 32 mm, it is possible to couple the magnetron $6a$ to the standard support $1a$ as shown in FIG. 2A and to measure the output characteristic of magnetron without any difficulty. A dimension of the support as shown in FIG. 2A is 54.6 mm. Where the height of antenna $7b$ is 20 mm, (See FIG. 2B where a dimension of the support is 25 mm) however, the above-mentioned coupling degree can not be accomplished. As a result, the matching condition of impedance can not be maintained, making it impossible to measure the characteristic of magnetron. Consequently, an exclusive waveguide system which is equipped with an exclusive support $1b$ for a magnetron $6b$ with an antenna of 20 mm, as shown in FIG. 2B must be used. Such an exclusive waveguide system can be effectively used in laboratory level measurement. Where mass measurement is carried out using the same exclusive waveguide system, however, the total cost for the measurement is very expensive, due to the extensive time required for replacing the supports and the taper type waveguides and the difficulty in installing an additional exclusive system.

SUMMARY OF THE INVENTION

An object of the invention is to eliminate the above-mentioned disadvantages encountered in the prior art and to provide a support for a waveguide system capable of measuring the output characteristics of magnetrons having different dimensions.

In accordance with one aspect, the present invention provides a support for a waveguide system comprising: a support body; a receiver formed at one side portion of the support body; a control plate selectively coupled to the receiver and adapted to control the coupling condition between the support body and a magnetron separably coupled to the support body to achieve a matching condition of impedance, thereby capable of a measurement of the output characteristic of one of two kinds of magnetrons with different antenna dimensions; and a closing plate coupled to the receiver when the control plate is not coupled to the receiver and the output characteristic of the other kind of magnetron is to be measured and for closing the receiver.

In accordance with another aspect, the present invention provides a support for a waveguide comprising: a support body; a plurality of receivers perforated at side portions of the support body, respectively; and a plurality of control members coupled to the receivers, respectively.

BRIEF DESCRIPTION OF THE DRAWINGS

Other objects and aspects of the invention will become apparent from the following description of embodiments with reference to the accompanying drawings in which:

FIGS. 4A to 4C are perspective views showing the support and different portions of coupling degree control means coupled to the support, wherein FIG. 4A shows the launcher, FIG. 4B shows a control plate and FIG. 4C shows a closing plate;

DESCRIPTION OF THE PREFERRED EMBODIMENTS

Figure 1A:
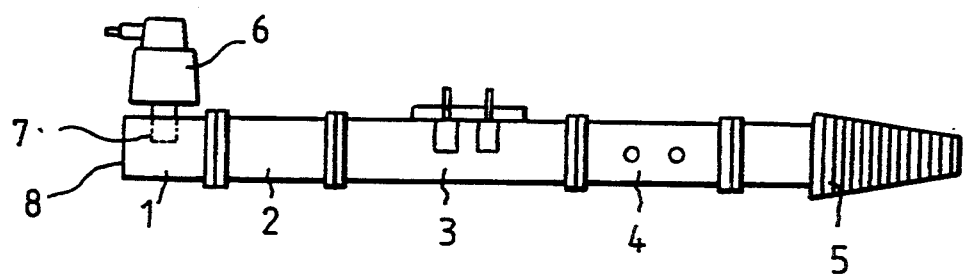
FIGS. 1A and 1B are a front view and a plan view of a conventional waveguide system to which a magnetron is coupled, respectively.
Figure 1B:
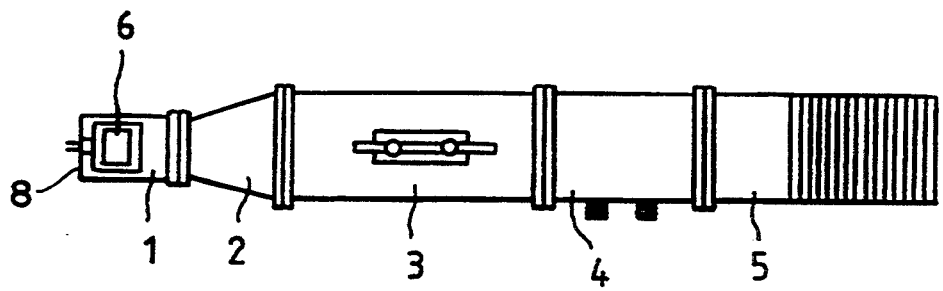
Figure 2A:
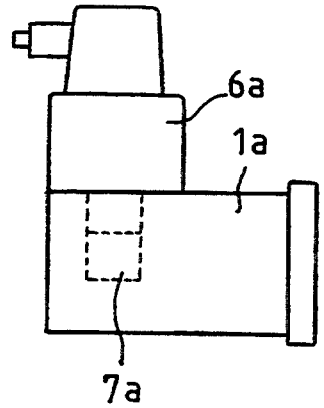
FIG. 2A is a front view of a standard support to which a well-known magnetron having an antenna with a height of 29 mm to 32 mm is coupled.
Figure 2B:
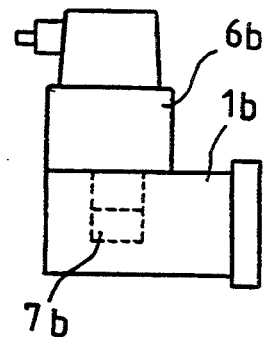
FIG. 2B is a front view of an exclusive support to which a well-known magnetron having an antenna with a height of 20 mm is coupled.
Figure 3A:
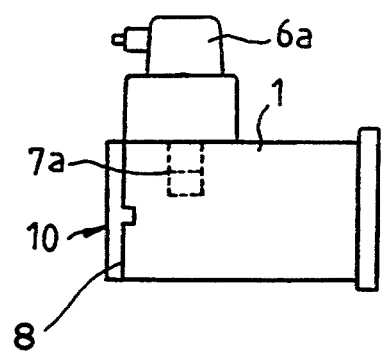
FIGS. 3A and 3B are front views showing using conditions of a support according to an embodiment of the present invention.

Referring to FIGS. 3A to 6, there is illustrated a waveguide system with a support in accordance with the present invention. FIGS. 3A and 3B are front views showing the use of a support according to an embodiment of the present invention and constructions separably attached to the support. FIGS. 4A to 4C are perspective views showing the support and different portions of coupling degree control means coupled to the support, respectively.

Figure 3B:
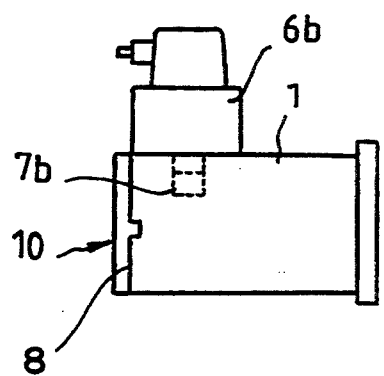

As shown in FIGS. 3A and 3B, the support comprises a support body 1 adapted to measure the output characteristic of a magnetron which will be coupled to the support body 1 and coupling degree control means 10 for controlling the coupling condition between the support body 1 and a magnetron separably coupled to the support body 1, thereby enabling measurements of the output characteristics of two kinds of magnetrons with different antenna dimensions. As shown in FIGS. 3A and 3B, the two kinds of magnetrons may be a first magnetron 6a having an antenna 7a with a height of 29 to 32 mm and a second magnetron 6b having an antenna 7b with a height of 20 mm.

Figure 4A:
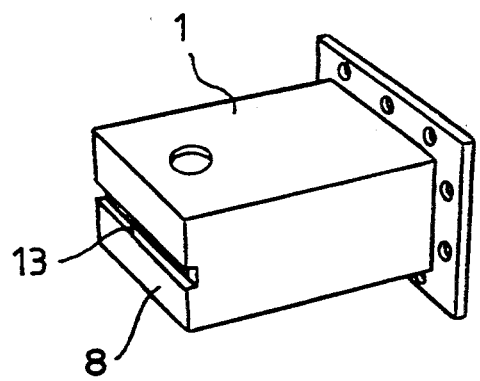
Figure 4B:
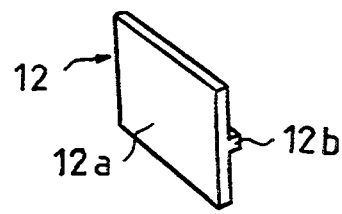

The support body 1 includes a back flange 8 provided with a receiver 13 (See FIG. 4A). The receiver is in the form of an aperture. A control means can be received in the aperture and coupled thereto. On the other hand, the coupling degree control means 10 comprises a control plate 11 (See FIG. 4C), adapted to be coupled to the receiver 13 (FIG. 4A) for achieving the matching condition of impedance when the second magnetron 6b is coupled to the support body 1 to measure its output characteristic and a closing plate 12 adapted to be coupled to the receiver 13 for closing the receiver 13 when the first magnetron 6a is coupled to the support body 1 to measure its output characteristic.

Figure 4C:
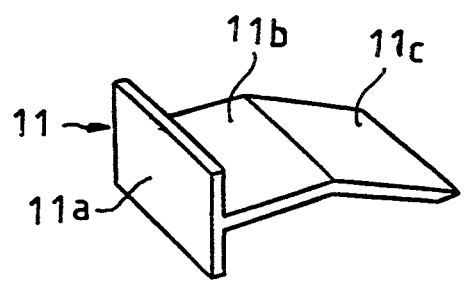

As illustrated in FIG. 4C, the control plate 11 has a side plate portion 11a having the same size as the back flange 8 of the support body 1, an extension portion 11b extending from the side plate portion 11a and an inclined portion 11c extending inclinedly from the extension portion 11c. On the other hand, the closing plate 12 (See FIG. 4B) has a side plate portion 12a and a closing protrusion 12b protruded from the side plate portion 12a and adapted to close the receiver 13 of the support body 1.

Where the second magnetron 6b is coupled to the launcher body 1 to measure its output characteristic, the control plate 11 is coupled to the receiver 13 formed at the back flange 8 of support body 1, as shown in FIG. 3B. In this case, the control plate 11 controls a capacitance, an inductance and resistance exhibited between the support body 1 and the second magnetron 6b having the antenna with the height of 20 ram, to be the same as in the first magnetron 6a. Accordingly, the coupling degree between the support body 1 and the antenna 7b of the second magnetron 6b so that the output characteristic of the second magnetron 6b can be measured without any difficulty.

Where the first magnetron 6a is coupled to the support body 1, to measure its output characteristic, the control plate 11 which has been coupled to the receiver 13 of the support body 1 is separated from the receiver 13 and then the closing plate 12 is coupled to the receiver 13, so as to close the receiver 13. Under this condition, the first magnetron 6a is coupled to the support body 1.

Figure 5A:
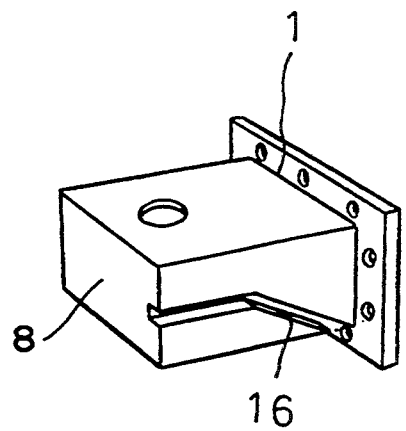
FIGS. 5A to 5C are perspective views of a support, a control plate and a closing plate in accordance with another embodiment of the present invention, respectively.
Figure 5B:
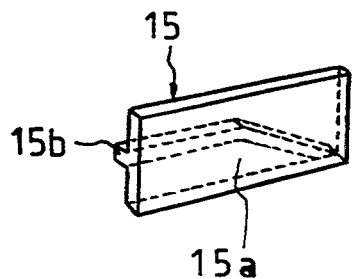
Figure 5C:
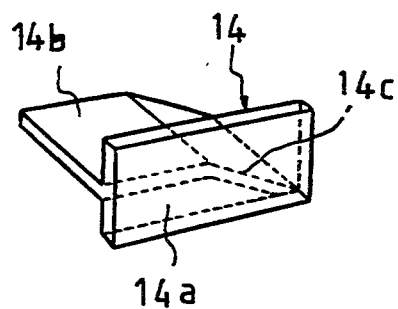

FIGS. 5A to 5C show another construction of support according to another embodiment of the present invention. In this embodiment, the support body 1 of the support includes a receiver 16 formed at its front portion, as illustrated in FIG. 5A. On the other hand, the coupling degree control means 10 comprises a control plate 14 adapted to be coupled to the receiver 16 for achieving the matching condition of impedance when the second magnetron 6b is coupled to the front portion of the support body 1 to measure its output characteristic and a closing plate 15 adapted to be coupled to the receiver 16 for closing the receiver 16 when the first magnetron 6a is coupled to the support body 1 to measure its output characteristic.

As illustrated in FIG. 5c, the control plate 14 has a side plate portion 14a having the same size as the front portion of the support body 1, an extension portion 14b extending from the side plate portion 14a and an inclined portion 14c extending inclinedly from the extension portion 14c. On the other hand, as illustrated in FIG. 5B, the closing plate 15 has a side plate portion 15a and a closing protrusion 15b protruded from the side plate portion 15a and adapted to close the receiver 13 of the support body 1.

The coupling degree control means 10 is adapted to couple its control plate 11 and its closing plate 12 to the side portion of the support body 1 in case of the first embodiment and to couple its control plate 14 and its closing plate 15 to the front portion of the launcher body 1 in case of the second embodiment. Accordingly, proper elements of the coupling degree control means 10 can be selected, depending on the installation condition of an object to be measured.

Figure 6:
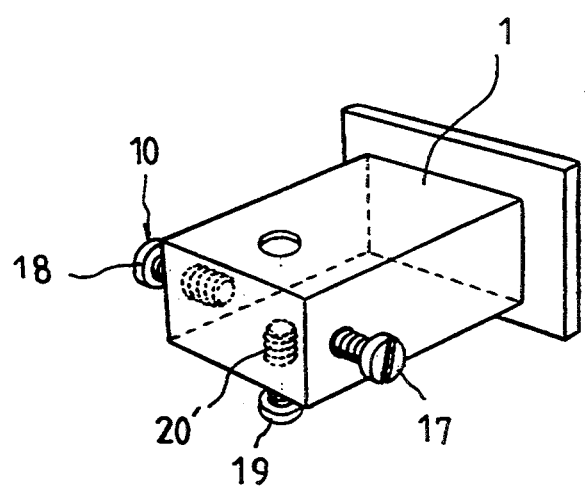
FIG. 6 is a perspective view showing a coupling condition between a support and coupling degree control means in accordance with another embodiment of the present invention.

Referring to FIG. 6, there is illustrated a support according to another embodiment of the present invention. In this embodiment, the support body 1 includes a plurality of receivers 20 at its both sides and bottom portions. Accordingly, the coupling degree control means 10 comprises a plurality of control members coupled to the receivers 20, respectively.

In the illustrated embodiment, the control members are control screws 17, 18 and 19. Of course, other rod type members may be used. In case of the embodiment shown in FIG. 6, the capacitance between an antenna of a magnetron coupled to the support body and each of control screws 17, 18 and 19 can be varied, as the control screws are tightened or loosened. That is, the capacitance can be controlled by adjusting the control screws 17, 18 and 19, to achieve the matching condition of impedance. As a result, it is possible to measure the output characteristics of magnetrons 6a and 6b.

As apparent from the above description, the present invention provides a support for a waveguide system capable of measuring the output characteristics of a plurality of magnetrons having different dimensions. The support makes it possible to reduce greatly the cost in measurement, as compared with the prior arts requiring exclusive systems for individual magnetrons having different dimensions. The support according to the present invention also eliminates the work of replacing the waveguide system every time when the model of magnetron to be measured is changed, thereby enabling the productivity of magnetrons to be improved. Such work which is required in the prior art is troublesome and requires an extensive amount of time.

Although the preferred embodiments of the invention have been disclosed for illustrative purpose, those skilled in the art will appreciate that various modifications, additions and substitutions are possible, without departing from the scope and spirit of the invention as disclosed in the accompanying claims.

What is claimed is:

1. A support for a waveguide system comprising:
   a support body having a top portion, a bottom portion a front side portion and a back side portion;
   means located on the top portion of the support body for receiving magnetron antennas of different sizes therein, the respective antennas being part of corresponding magnetrons;
   an aperture provided at the front side portion of the support body; and
   a closing plate detachably coupled to said aperture for controlling the coupling condition between the support body and an antenna of a magnetron separably coupled to the means for receiving body to achieve a matching condition of impedance, thereby allowing measurements of output characteristics of the separably coupled magnetron.

2. A support for a waveguide system in accordance with claim 1, wherein the closing plate has a side plate portion having a width which is equal to a width of the front side portion of the support body, said closing plate including a closing protrusion protruded from the side plate portion.

3. A support for a waveguide system in accordance with claim 1, wherein the closing plate includes a side plate portion having a width equal to a width of the front side portion and the closing plate portion includes an extension portion extending from the side plate portion and an inclined portion extending from the extension portion.

4. A support for a waveguide system comprising:
   a support body having a top portion, a bottom portion, a front side portion, a back side portion and a front facing side portion;
   means located on the top portion for receiving different size magnetron antennas which are attached to corresponding magnetrons;
   an aperture provided at the front facing side portions of the support body; and
   coupling degree control means coupled to said aperture for controlling the coupling condition between the support body and an antenna of a magnetron separably coupled to the means for receiving to achieve a matching condition of impedance thereby allowing measurements of output characteristics of the antenna of the separably coupled magnetron.

5. A support for a waveguide system in accordance with claim 4, wherein said coupling degree control means is a closing plate having a side plate portion and a closing protrusion.

6. A support for a waveguide system comprising:
   a support body having two sides, a top portion, and a bottom portion;
   means located on the top portion of the support body for receiving magnetron antennas of different sizes therein, the respective antennas being part of a corresponding magnetron,
   a plurality of apertures at the two sides and bottom of the support body, respectively;
   a plurality of control screws, each one of said control screws coupled to a respective one of said apertures for controlling the coupling condition between the support body and an antenna of a magnetron separably coupled to the means for receiving to achieve a matching condition of impedance, thereby allowing measurements of output characteristic of the separably coupled magnetron.

7. A support for a waveguide system in accordance with claim 7, wherein said coupling degree control means is a closing plate having a side plate portion, an extension portion extending from said side plate portion and an inclined portion extending inclinedly from said extension portion.

* * * * *